United States Patent [19]
Fredricksen

[11] Patent Number: 4,600,905
[45] Date of Patent: Jul. 15, 1986

[54] FLAT PASSBAND ETCHED GROOVE SAW FILTER

[75] Inventor: Hans P. Fredricksen, Burnsville, Minn.

[73] Assignee: The United States of America as represented by the Secretary of the Army, Washington, D.C.

[21] Appl. No.: 771,968

[22] Filed: Sep. 3, 1985

[51] Int. Cl.[4] .................. H03H 9/64; H03H 9/145
[52] U.S. Cl. ........................... 333/196; 310/313 B; 333/193
[58] Field of Search .................... 333/150–155, 333/193–196; 310/313 R, 313 A, 313 B, 313 C, 313 D

[56] References Cited

U.S. PATENT DOCUMENTS

| 4,237,433 | 12/1980 | Tanski | 333/196 X |
| 4,388,146 | 1/1983 | Ballato | 156/626 |
| 4,389,275 | 6/1983 | Ballato | 156/626 |
| 4,999,440 | 2/1985 | Grudkowski | 333/154 X |

OTHER PUBLICATIONS

Naraine et al—"Wide Band Linear Phase Saw Filters Using Apodized Slanted Finger Transducers", Proc. IEEE Ultrasonics Symposium, Oct. 1983; pp. 113–116.
Tanski—"Developments in Resonators on Quartz", 1977 Ultrasonics Symposium Proceedings, Phoenix, Az., U.S.A., (26–28 Oct. 1977) pp. 900–904, 904a.

Primary Examiner—Marvin L. Nussbaum
Attorney, Agent, or Firm—Anthony T. Lane; Jeremiah G. Murray; John T. Rehberg

[57] ABSTRACT

An acoustic surface wave device is configured as a bandpass filter. The device employs two interdigital transducer pairs for input and output. Each transducer pair has a slant finger geometry. The fingers are electrodeposited into grooves etched into the substrate. The grooves are deeper at the high frequency side of the substrate. The grooves enhance the electromechanical coupling of high frequency components and thus provide a flatter amplitude response curve.

9 Claims, 8 Drawing Figures

FLAT PASSBAND ETCHED GROOVE SAW FILTER

The invention described herein may be manufactured, used and licensed by or for the Government without payment to me of any royalty thereon.

BACKGROUND OF THE INVENTION

1. Field of the Invention

This invention relates generally to bandpass filters and more particularly to solid state microwave bandpass filters which utilize surface acoustic waves in a piezoelectric medium.

2. Description of the Prior Art

Surface acoustic wave (SAW) devices are often employed as filters or resonators in high frequency applications.

The advantages of using SAW devices over other frequency control methods such LC circuits, coaxial delay lines, or metal cavity resonators are high Q, low series resistance, small size and good frequency-temperature stability. SAW resonators also possess advantages over bulk acoustic wave resonators because the latter must be cut very thin to achieve high frequencies and are consequently quite fragile.

Typically, a SAW device contains a substrate of piezoelectric material such as quartz, lithium niobate, zinc oxide or cadmium sulfide. Input and output transducers are formed upon the substrate. The transducers convert input electrical signals to surface acoustic waves (SAWs) propagating upon the surface of the substrate and then reconvert the acoustic energy to an electric output signal. The input and output transducers are frequently configured as interdigital electrode fingers which extend from pairs of transducer pads. Interdigital transducers may be formed by depositing a thin film of electrically conductive material upon a piezoelectric substrate.

Alternating electrical potential coupled to the input interdigital transducers induces mechanical stresses in the piezoelectric substrate. The resulting strains propagate away from the input transducer along the surface of the substrate in the form of surface acoustic waves. These propagating surface waves arrive at the output interdigital transducer where they are reconverted to electrical signals.

An article pertinent to the understanding to the present invention is: P. M. Naraine and C. K. Campbell, "Wideband Linear Phase SAW Filters Using Apodized Slanted Finger Transducers", Proc. IEEE Ultrasonics Symposium, October 1983, pp. 113–116. The Naraine et al. article discusses a method for designing wide band linear phase SAW filters using apodized slanted finger transducers. Slanted finger transducer geometries have all of the transducer fingers positioned along lines which emanate from a single focal point. The use of slanted finger geometeries on both the inut and output transducers permits the transduction of a wide range of surface acoustic wavelengths from input to output transducer, and thus, provides an electrical filter with a wide frequency passband. High frequency components are transduced across the side of the substrate nearest the input and output focal points where the finger-to-finger distance is least. Low frequency components are transduced across the opposite side of the substrate where the finger-to-finger distance is greatest. The Naraine article states that for filters employing slanted finger transducer geometries, "both theory and experiment indicated an inherent negative slope of the amplitude response with increasing frequency, which could be as large as approximately 5 dB for the 50% bandwidth case." op. cit. p. 113. Naraine's article describes a method of flattening the amplitude response curve of a slanted finger filter by utilizing finger apodization. Apodization is a technique in which the length of individual transducer fingers is selectively adjusted so that the overlap between fingers of opposite polarities changes along the path traveled by the surface acoustic wave. Naraine discloses the results of a computer optimization program which is used to obtain a transducer finger apodization pattern which modifies the slanted finger geometry. The result is a flatter amplitude response curve. However, the effect of the Naraine apodization technique is to achieve a flat passband by reducing the coupling of low frequency components, thus reducing the amplitude of the low frequency portion of the amplitude response curve.

The overall performance of a slant-finger SAW filter would be enhanced if the amplitude of the high frequency portion of the response curve were increased. The result would be an amplitude response curve with the desired flat plateau and a greater overall amplitude. The present invention achieves a flat amplitude response curve by increasing the coupling of high frequency components instead of decreasing the coupling of low frequency components. Thus the present invention achieves a smooth, flat passband without sacrificing low frequency signal amplitude.

BRIEF SUMMARY OF THE INVENTION

It is an object of the present invention to provide a simple, relatively inexpensive, compact microwave bandpass filter.

It is another object of the present invention to provide an effective SAW device which is amenable to mass-production techniques.

A further object of the present invention is to provide a SAW filter with a flat amplitude response curve.

Still another object of the present invention is to provide a SAW filter with a flat amplitude response curve which does not sacrifice low frequency energy.

A still further object of the present invention is to provide a SAW filter utilizing slanted finger transducer geometry with augmented high frequency coupling.

The present invention features transducers with slant finger geometry. However, the transducers are not apodized. The lengths of all of the transducer fingers are equal. However, high frequency electromechanical coupling is augmented by depositing the slanted fingers over grooves whose depth increases toward the high frequency side of the substrate. The precise manner in which the depth of the grooves is varied depends upn the amount of increase in electromechanical coupling provided by grooved transducers for a given slant finger geometry. Fabrication of the graded grooves may be accomplished using techniques which have been outlined in U.S. Pat. No. 4,388,146 or U.S. Pat. No. 4,389,275, issued to A. Ballato. The precise profile of the grooves cut in the piezoelectric substrate may be determined by theory or by experiment for a given slant finger geometry.

Because the depth of the groove is greater at the high frequency region of the substrate than at the low frequency region of the transducer, electromechanical coupling of high frequency components is increased.

Consequently, the negative slope of the amplitude response curve with increasing frequency, observable in the prior art, is corrected, yielding an amplitude response curve with a flatter profile.

Further objects and advantages of the present invention will become apparent to those familiar with the art upon examination of the following detailed description and accompanying drawings.

DETAILED DESCRIPTION OF THE PREFERRED EMBODIMENTS

Figure 1:
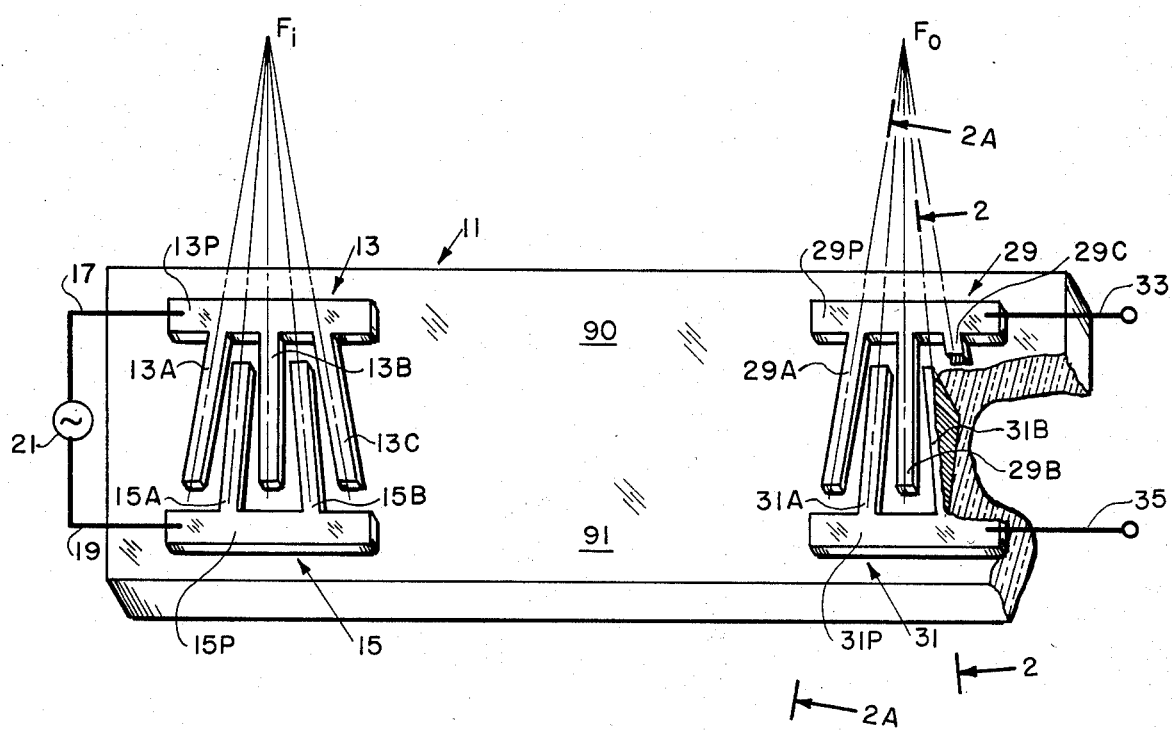
FIG. 1 is a perspective view of one preferred embodiment of the present invention.

Referring to the drawings, and more particularly to FIG. 1, wherein like numerals refer to like components throughout, reference numeral 11 designates generally a piezoelectric substrate. A pair of input interdigital transducers, designated generally 13 and 15, are deposited upon the piezoelectric substrate 11. The individual fingers, 13A, 13B, 13C, protrude from pad 13P, while fingers 15A and 15B protrude from pad 15P. The fingers are slanted so that imaginary lines drawn through the center of each of the fingers intersect at a focal point $F_i$. The input transducers 13 and 15 are connected by connectors 17 and 19 to an input RF signal 21. The acoustic wavelength which is most efficiently transduced by an interdigital transducer depends upon the spacing between adjacent fingers. Since the spacing between adjacent fingers, for example 13A and 15A in FIG. 1, varies, the input transducers 13 and 15 are capable of effectively converting a broadband RF electrical signal into a broadband surface acoustic wave.

The broadband surface acoustic wave emanating from input transducers 13 and 15 propagates along the piezoelectric substrate 11 until it encounters a pair of similarly configured output transducers 29 and 31. The transducers 29 and 31 reconvert acoustic vibrations to an alternating electric potential which is connected to external circuitry via connectors 33 and 35. The output transducers 29 and 31 have fingers 29A, 29B and 29C, 31A and 31B connected to pads 29P and 31P respectively. The output fingers are all slanted towards focal point $F_o$. The slanted finger output geometry insures that the broadband signal impinging upon transducers 29 and 31 is effectively converted to a broadband RF electrical signal. In practice, of course, a device may involve transducers with thousands of fingers. Only a few fingers are illustrated in FIG. 1 for convenience.

Because, as has already been indicated, the wavelength of the surface acoustic waves most efficiently transduced depends upon the spacing between adjacent transducer fingers, high frequency components are more efficiently transduced by closely spaced fingers, and low frequency components by fingers spaced farther apart. Thus, high frequency components are transduced generally along area 90 of substrate 11 and low frequency components are transduced generally along area 91 of substrate 11. In other words, high frequency components are generated by the portion of the transducer closest to the focal points $F_i$ and high frequency components are most efficiently received by the portion of the transducer closest to focal point $F_o$.

Figure 5A:
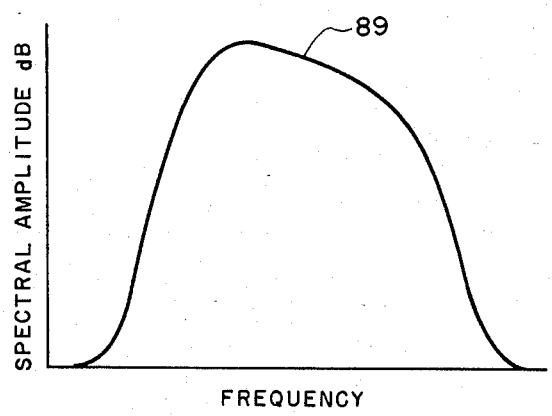
FIGS. 5A and 5B are graphs illustrative of the amplitude response curves of prior art devices.

The electronic performance of a typical prior art device with slant figure geometry is well known. FIG. 5A illustrates generally the amplitude response of a typical slant finger prior art device measured at terminals 33 and 35. The plateau 89 of the amplitude response curve of FIG. 5A shows a decrease in spectral amplitude with increasing frequency.

Figure 5B:
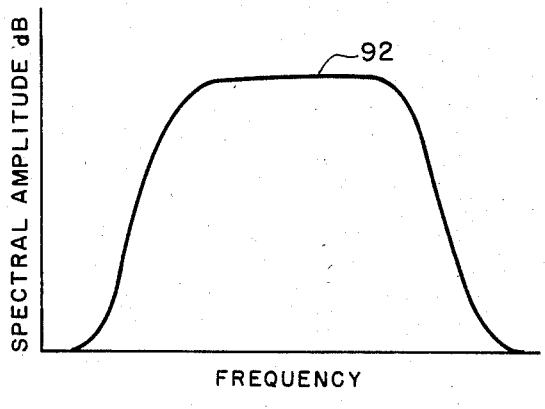
Figure 6:
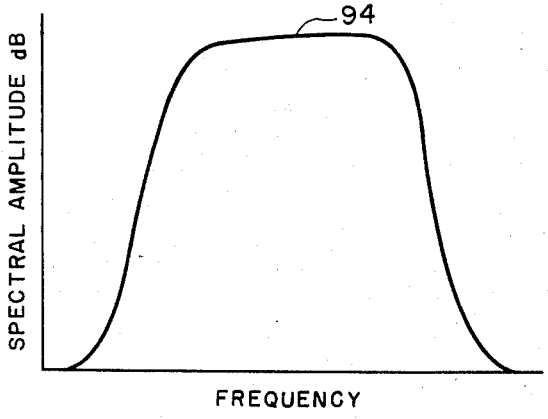
FIG. 6 is a graph illustrative of the amplitude response of the present invention.

FIG. 5B represents the amplitude response of the apodized slant finger device taught by Naraine. The difference between the amplitude response curves of FIG. 5A and FIG. 5B is that the plateau 92 of FIG. 5B has been leveled by a reduction in amplitude of the low frequency components. FIG. 6 illustrates the amplitude response of the present inventive device. The plateau 94 of the amplitude response curve in FIG. 6 resembles the plateau 89 of the prior art devices of FIG. 5A with the spectral amplitude of the high frequency components increased until the plateau is nearly level. The spectral amplitude of high frequency components is increased by the use of the grooved transducer structure described below.

Figure 2:
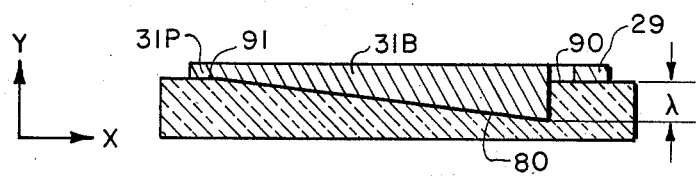
FIG. 2 is a side elevation cross sectional view of the device of FIG. 1, cut along the line 2—2 and looking in the direction of the arrows.

FIG. 2 is a side elevation cross sectional view which illustrate the profile of a representative transducer finger 31B. A graded groove 80 is cut into the top surface of the piezoelectric substrate 11. Fabrication of the graded groove may be accomplished using techniques which have been outlined in U.S. Pat. No. 4,388,146 or U.S. Pat. No. 4,389,275, both issued to A. Ballato. The depth of the groove is deepest at the high frequency side 90 of the substrate. In the embodiment of FIG. 2 the groove profile is a straight line extending from the low frequency end to the high frequency end of the finger 31B. Metallic finger material is deposited upon the surface of the substrate and into the etched groove by techniques well known in the prior art. The depth of the groove at its deepest point is λ, which is the shortest wavelength of the acoustic wave spectrum which is transduced.

Because the depth of the groove is greater at the high frequency region of the transducer than at the low frequency region of the transducer, electromechanical coupling of high frequency components is enhanced. Consequently, the negative slope of the amplitude response curve with increasing frequency, observable in FIG. 5A is corrected, yielding the amplitude response curve of FIG. 6.

Figure 2A:
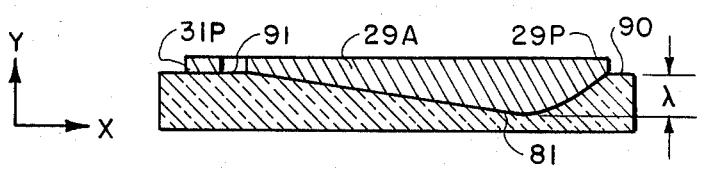
FIG. 2A is a side elevation cross sectional view of the device of FIG. 1 cut along the line 2A—2A and looking in the direction of the arrows.

FIG. 2A illustrates the typical profile of a transducer finger 29A emanating from the output transducer pad 29P nearer the focal point $F_o$. Finger 29A is deposited in a groove with a profile 81 which decreases linearly from the low frequency side 91 of the substrate to the high frequency side 90 of the substrate.

The fingers 13A, 13B, 13C, 15A, and 15B of the input transducer pair are also configured in identically profiled graded grooves whose depth uniformly increases toward the high frequency side of the substrate. Thus, in the present invention the input transducers 15 and 13 generate acoustic high frequency components with improved efficiency and the output transducers 29 and 31 reconvert high frequency acoustic components to electrical signals more efficiently. The resulting performance of the present inventive device is illustrated in FIG. 6, which shows a flat plateau 94 with increased spectral amplitude for high frequency components when compared to the prior art of FIG. 5A.

The Naraine reference illustrates how the behavior of a slanted finger interdigital transducer pair may be modeled. The transfer function H(f) of a slant finger interdigital transducer pair is given by:

$$H(f) = \sum_{j=o}^{s-1} A_j(f) \cdot f^{\frac{1}{2}} \frac{\sin N(f-f_j)/f_j}{N\pi(f-f_j)/f_j}$$

where $f_j$=center frequency of jth interdigital transducer strip, $A_j$=aperture width of jth strip, and N=number of finger pairs in the interdigital transducer.

In the present inventive device $A_j$ (f), the aperture width of the jth strip is also dependent upon the depth into which the transducer finger penetrates the substrate. That is, with reference to FIG. 2, $A_j$(f) depends upon the profile of the groove 80 cut into the substrate 11, and, consequently, $A_j$(f) is a function of the variables x and y, where, as shown in FIG. 2, x and y represent distances measured across the top surface of the substrate (from low frequency side 91 to high frequency side 90 for example,) and distances measured into the bulk of the substrate respectively. Symbolically, $A_j = A_j(f, x, y)$. The aperture width function, $A_j$, thus depends upon the electromechanical coupling between the substrate and the interdigital transducer material for any given depth (y) of cut into the substrate.

In general, the dependence of the aperture, $A_j(f, x, y)$, upon the electromechanical coupling between the substrate and the interdigital transducer material is not completely known. Therefore, the optimum shape of the profile of the groove cut into the substrate 11 is not known. It is possible that grooves with non-linear profiles provide more effective high frequency coupling.

Figure 3:
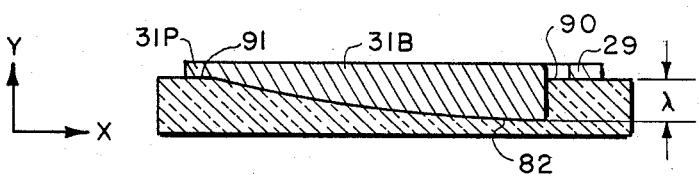
FIG. 3 is a side elevation cross sectional view of an alternative embodiment of the present invention.

However, the following procedure will reveal the optimum groove profile, while simultaneousely yielding a series of devices taught by the above-described inventive procedure. In FIG. 2, the profile of the groove 80 is essentially linear. The profile may be mathematically represented by an equation of form $y = mx$, where y and x represent directions defined above and m is a scale factor. Construction of a few devices with non-linear groove profiles will reveal the optimum groove profile for a given substrate-transducer combination. For example, FIG. 3 is a side elevation cross sectional view of an alternative embodiment of the present invention. FIG. 3 illustrates a groove 82 with a slightly non-linear profile. Mathematically, the shape of the groove profile 82 might be represented by an equation of the form $y = mx - ax^2$, where a is another scale factor.

Figure 4:
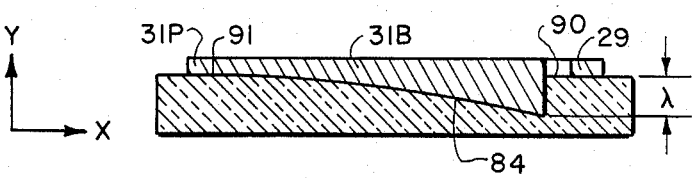
FIG. 4 is a side elevation cross sectional view of another alternative embodiment of the present invention.

FIG. 4 is a side elevation cross sectional view of another alternative embodiment of the present invention. The groove profile 84 of the substrate in the embodiment of FIG. 4 rises somewhat above the straight line profile of groove 80 in FIG. 2. It may be represented mathematically by an equation of the form: $y = -mx + bx^2$, where b is a scale factor.

The profiles 82 and 84 of FIGS. 3 and 4 respectively depart slightly from the linear profile 80 of FIG. 2. Measurement and comparison of the amplitude response curve of three devices configured generally in accordance with FIGS. 2, 3, and 4 will provide information of the groove profile which most effectively increases high frequency coupling, thus producing an amplitude response similar to FIG. 6. After it has been determined whether the addition (or subtraction) of a quadratic term to the groove profile improves the electromechanical coupling of high frequency components, the equation for the groove profile may be fine-tuned by construction and comparison of two or three devices with slightly different quadratic coefficients. This procedure will reveal the optimum groove profile for achieving the desired spectral amplitude response of FIG. 6. This experimental procedure will also provide values for the aperture widths, $A_j(f, x, y)$ in the Naraine model.

Alternatively, the optimum groove profile may be determined by standard experimental techniques which do not require the fabrication of complete SAW devices. Such experimental techniques simply require fabrication of uniform depth grooves in a chosen piezoelectric substrate and measurement of the electromechanical coupling when surface acoustic waves of various frequencies are incident upon the grooves. Data from such experiments will provide the information necessary to calculate the optimum groove profile for flat passband response. It should be noted that in all cases, the maximum groove depth is approximately one acoustic wavelength.

The illustrative embodiments herein are merely a few of those possible variations which will occur to those skilled in the art while using the inventive principles contained herein. Accordingly, numerous variations of invention are possible while staying within the spirit and scope of the invention as defined in the following claims.

What is claimed is:

1. A surface acoustic wave device comprising:

a piezoelectric substrate for propagating surface acoustic waves;

said substrate having first and second pluralities of electrode receiving grooves in the upper surface thereof and positioned generally transverse to the direction of propagation of said surface acoustic waves, said grooves having a depth which varies along the length thereof;

input transducer means at one end of said substrate having a pair of opposing transducer pads, each of said pads including a plurality of interdigitated electrode fingers, each of said fingers fitting within respective ones of said first plurality of electrode receiving grooves for exciting a surface acoustic wave upon said substrate in response to an electrical signal applied thereto; and output transducer means at the other end of said substrate and having a second pair of opposing transducer pads, each of said second pads including a plurality of interdigitated electrode fingers, each of said fingers fitting closely within respective ones of said second plurality of electrode receiving grooves, respective fingers of said input and output transducers having a corresponding depth which varies along the length thereof, said output transducer means serving to convert said surface acoustic wave excited upon said substrate into an electrical signal having improved frequency response characteristics.

2. The device of claim 1 wherein all of said input transducer electrode fingers and said first plurality of electrode receiving grooves are slanted toward a first common focal point.

3. The device of claim 1 wherein all of said output transducer electrode fingers and said second plurality of electrode receiving grooves are slanted toward a second common focal point.

4. The device of claim 1 wherein all of said grooves and electrode fingers have variable depth increasing in the direction of the respective focal point.

5. The device of claim 4 wherein the depth profile of all of said grooves varies in linearly increasing manner.

6. The device of claim 4 wherein the depth profile of all of said grooves varies in a non-linearly increasing manner.

7. The device of claim 4 wherein said surface acoustic waves are of a given frequency range, said slanted fingers and grooves having a closer spacing at the region of said substrate closest to said focal points, said region providing the most efficient transduction of higher frequencies.

8. The device of claim 1 wherein the lengths of said plurality of electrode fingers are substantially equal.

9. A surface acoustic wave device comprising:
   a piezoelectric substrate for propagating surface acoustic waves upon an upper surface thereof, said substrate having first and second pluralities of electrode receiving grooves in said upper surface and positioned generally transverse to the direction of propagation of said surface acoustic waves, all of said electrode grooves having like variable depth profiles;
   input transducer means at one end of said substrate having a first pair of opposing transducer pads, each of said pads including a first plurality of interdigitated electrode fingers, each of said fingers fitting within respective ones of said first plurality of electrode receiving grooves, and each of said fingers and said electrode grooves being slanted toward a common input focal point, said variable depth profile of said electrode grooves and fingers gradually increasing toward said input focal point, said input transducers serving to excite a surface acoustic wave upon said substrate in response to an electrical signal applied thereto; and
   output transducer means at the other end of said substrate substantially similar to said input transducer means and having a second pair of transducer pads, each of said pads including a second plurality of interdigitated electrode fingers, each of said fingers fitting within respective ones of said second plurality of electrode receiving grooves, and each of said fingers and said electrode grooves being slanted toward a common output focal point, said variable depth profile of said second plurality of grooves gradually increasing toward said output focal point, said output transducer means serving to convert said surface acoustic wave excited upon said substrate into an electrical signal having increased high frequency response.

* * * * *